(12) United States Patent
Keeth et al.

(10) Patent No.: US 10,468,382 B2
(45) Date of Patent: Nov. 5, 2019

(54) SIGNAL DELIVERY IN STACKED DEVICE

(71) Applicant: Micron Technology, Inc., Boise, ID (US)

(72) Inventors: Brent Keeth, Boise, ID (US); Mark Hiatt, Charlotte, NC (US); Terry R. Lee, Boise, ID (US); Mark Tuttle, Boise, ID (US); Rahul Advani, Boise, ID (US); John F. Schreck, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/137,931

(22) Filed: Apr. 25, 2016

(65) Prior Publication Data

US 2016/0240515 A1    Aug. 18, 2016

Related U.S. Application Data

(62) Division of application No. 13/361,183, filed on Jan. 30, 2012, now Pat. No. 9,324,690, which is a division
(Continued)

(51) Int. Cl.
*B23P 19/00* (2006.01)
*H01L 25/065* (2006.01)
(Continued)

(52) U.S. Cl.
CPC .......... *H01L 25/0657* (2013.01); *H01L 23/50* (2013.01); *H01L 23/66* (2013.01);
(Continued)

(58) Field of Classification Search
CPC .......... H01L 23/5383; H01L 23/49822; H05K 2201/10378; Y10T 29/4913;
(Continued)

(56) References Cited

U.S. PATENT DOCUMENTS

| 5,347,428 A | 9/1994 | Carson et al. |
|---|---|---|
| 5,432,729 A | 7/1995 | Carson et al. |

(Continued)

FOREIGN PATENT DOCUMENTS

| CN | 1509134 A | 6/2004 |
|---|---|---|
| CN | 1665027 A | 9/2005 |

(Continued)

OTHER PUBLICATIONS

"China Patent Application No. 200880108725.5, Office Action dated Apr. 26, 2011", 13 pgs.
(Continued)

*Primary Examiner* — Thiem D Phan
(74) *Attorney, Agent, or Firm* — Schwegman Lundberg & Woessner, P.A.

(57) ABSTRACT

Some embodiments include apparatus, systems, and methods having a base, a first die, a second arranged in a stacked with the first die and the base, and a structure located in the stack and outside at least one of the first and second dice and configured to transfer signals between the base and at least one of the first and second dice.

8 Claims, 12 Drawing Sheets

Related U.S. Application Data of application No. 12/209,052, filed on Sep. 11, 2008, now Pat. No. 8,106,520.

(51) Int. Cl.
*H01L 23/50* (2006.01)
*H01L 23/66* (2006.01)
*H01L 23/538* (2006.01)

(52) U.S. Cl.
CPC ...... *H01L 25/0655* (2013.01); *H01L 23/5385* (2013.01); *H01L 2223/6677* (2013.01); *H01L 2224/0401* (2013.01); *H01L 2224/06181* (2013.01); *H01L 2224/14181* (2013.01); *H01L 2224/16145* (2013.01); *H01L 2224/16146* (2013.01); *H01L 2224/16225* (2013.01); *H01L 2224/16227* (2013.01); *H01L 2224/16235* (2013.01); *H01L 2224/17181* (2013.01); *H01L 2225/0652* (2013.01); *H01L 2225/06513* (2013.01); *H01L 2225/06517* (2013.01); *H01L 2225/06541* (2013.01); *H01L 2225/06572* (2013.01); *H01L 2924/01004* (2013.01); *H01L 2924/15192* (2013.01); *H01L 2924/15311* (2013.01); *Y10T 29/49165* (2015.01); *Y10T 29/5317* (2015.01)

(58) Field of Classification Search
CPC ......... Y10T 29/49124; Y10T 29/49126; Y10T 29/49165; Y10T 29/49117; Y10T 29/5317
USPC ... 29/830, 825, 832, 834, 837, 841, 846, 85, 29/738, 729, 852; 174/258, 260, 262, 174/264; 257/698, 777, E23.125, 257/E23.141, E23.178, E25.013
See application file for complete search history.

(56) References Cited

U.S. PATENT DOCUMENTS

| | | | |
|---|---|---|---|
| 5,719,438 A | 2/1998 | Beilstein, Jr. et al. | |
| 5,786,628 A | 7/1998 | Beilstein, Jr. et al. | |
| 5,807,791 A | 9/1998 | Bertin et al. | |
| 5,815,427 A | 9/1998 | Cloud et al. | |
| 5,977,640 A | 11/1999 | Bertin et al. | |
| 5,982,027 A | 11/1999 | Corisis | |
| 6,081,463 A | 6/2000 | Shaffer et al. | |
| 6,141,744 A | 10/2000 | Wing | |
| 6,376,909 B1 | 4/2002 | Forbes et al. | |
| 6,461,895 B1 | 10/2002 | Liang et al. | |
| 6,600,364 B1 | 7/2003 | Liang et al. | |
| 6,625,037 B2 | 9/2003 | Nakatani et al. | |
| 6,856,009 B2 | 2/2005 | Bolken et al. | |
| 7,030,317 B1 | 4/2006 | Oman | |
| 7,102,219 B2 | 9/2006 | Hanaoka et al. | |
| 7,145,249 B2 | 11/2006 | Chao et al. | |
| 7,279,795 B2 | 10/2007 | Periaman et al. | |
| 7,301,748 B2 | 11/2007 | Anthony et al. | |
| 7,464,225 B2 | 12/2008 | Tsern | |
| 7,531,905 B2 * | 5/2009 | Ishino ..................... H01L 24/73 257/686 |
| 7,623,365 B2 | 11/2009 | Jeddeloh | |
| 7,872,936 B2 | 1/2011 | Blankenship | |
| 8,106,520 B2 | 1/2012 | Keeth et al. | |
| 8,174,859 B2 | 5/2012 | Jeddeloh | |
| 8,339,827 B2 | 12/2012 | Jeddeloh | |
| 8,593,849 B2 | 11/2013 | Jeddeloh | |
| 9,001,548 B2 | 4/2015 | Jeddeloh | |
| 9,324,690 B2 | 4/2016 | Keeth et al. | |
| 2003/0020171 A1 | 1/2003 | Dutta et al. | |
| 2003/0197281 A1 | 10/2003 | Farnworth et al. | |
| 2004/0064599 A1 | 4/2004 | Jahnke et al. | |
| 2005/0189639 A1 | 9/2005 | Hisashi et al. | |
| 2006/0113653 A1 | 6/2006 | Xiaoqi et al. | |
| 2006/0125069 A1 | 6/2006 | Gabara | |
| 2006/0233012 A1 | 10/2006 | Sekiguchi et al. | |
| 2007/0001281 A1 | 1/2007 | Ishino et al. | |
| 2007/0004240 A1 | 1/2007 | Dibene et al. | |
| 2007/0013080 A1 | 1/2007 | DiBene et al. | |
| 2007/0014168 A1 | 1/2007 | Rajan | |
| 2007/0048994 A1 | 3/2007 | Tuttle | |
| 2007/0070669 A1 | 3/2007 | Tsern | |
| 2007/0102733 A1 | 5/2007 | Zhou | |
| 2007/0120569 A1 | 5/2007 | Sukegawa et al. | |
| 2007/0181991 A1 | 8/2007 | Ishino et al. | |
| 2008/0001271 A1 | 1/2008 | Marcinkiewicz | |
| 2008/0303031 A1 | 12/2008 | Toh | |
| 2009/0059641 A1 | 3/2009 | Jeddeloh | |
| 2010/0059898 A1 | 3/2010 | Keeth et al. | |
| 2010/0061134 A1 | 3/2010 | Jeddeloh | |
| 2010/0091537 A1 | 4/2010 | Best et al. | |
| 2012/0182776 A1 | 7/2012 | Best et al. | |
| 2012/0218803 A1 | 8/2012 | Jeddeloh | |
| 2013/0036606 A1 | 2/2013 | Keeth et al. | |
| 2013/0083585 A1 | 4/2013 | Jeddeloh | |
| 2014/0063942 A1 | 3/2014 | Jeddeloh | |

FOREIGN PATENT DOCUMENTS

| | | |
|---|---|---|
| CN | 1976014 A | 6/2007 |
| CN | 101017812 A | 8/2007 |
| CN | 102150258 A | 8/2011 |
| CN | 101809738 B | 7/2012 |
| CN | 102150258 B | 7/2014 |
| JP | 02287847 | 11/1990 |
| JP | 2287847 A | 11/1990 |
| JP | 06291250 A | 10/1994 |
| JP | 2002259322 A | 9/2002 |
| JP | 2004327474 A | 11/2004 |
| JP | 2005038454 A | 2/2005 |
| JP | 2005141829 A | 6/2005 |
| JP | 2005244143 A | 9/2005 |
| JP | 2006279016 A | 10/2006 |
| JP | 2006330974 A | 12/2006 |
| JP | 2007129412 A | 5/2007 |
| JP | 2007157226 A | 6/2007 |
| JP | 2007194444 A | 8/2007 |
| JP | 2008004853 A | 1/2008 |
| JP | 2003060153 A | 2/2013 |
| JP | 2007188916 A | 7/2013 |
| KR | 101382985 B1 | 4/2014 |
| WO | WO-07029253 | 3/2007 |
| WO | WO-20080303031 A1 | 12/2008 |
| WO | WO-09032153 A3 | 3/2009 |
| WO | WO-2009032153 A2 | 3/2009 |
| WO | WO-2010030804 A1 | 3/2010 |

OTHER PUBLICATIONS

"China Patent Application No. 200880108725.5, Response filed Aug. 16, 2011 to Office Action dated Apr. 26, 2011", 13 pgs.
"Chinese Application Serial No. 200880108725.5, Office Action dated Sep. 6, 2011", 7 pgs.
"Chinese Application Serial No. 200880108725.5, Response filed Dec. 6, 2011 to Office Action dated Oct. 28, 2011", 8 pgs.
"Chinese Application Serial No. 200980135828.5, Office Action dated Jul. 17, 2013", 13 pgs.
"Chinese Application Serial No. 200980135828.5, Office Action dated Nov. 1, 2012", 9 pgs.
"Chinese Application Serial No. 200980135828.5, Response filed May 3, 2013 to Office Action dated Nov. 1, 2012", 15 pgs.
"Chinese Application Serial No. 200980135828.5, Response filed Nov. 28, 2013 to Office Action dated Jul. 17, 2013", w/English Claims, 48 pgs.
"European Application No. 09813621.1, Search Report dated Aug. 31, 2011", 5 pages.
"European Application Serial No. 09813621.1 Response filed Dec. 30, 2014 to Non-Final Office Action dated Jun. 26, 2014", With the amended claims, 12 pgs.
"European Application Serial No. 09813621.1, Examination Notification Art. 94(3) dated Jun. 26, 2014", 5 pgs.

(56) References Cited

OTHER PUBLICATIONS

"European Application Serial No. 09813621.1, Office Action dated Apr. 4, 2012", 4 pgs.
"European Application Serial No. 09813621.1, Office Action Response filed Mar. 1, 2012", 12 pgs.
"European Application Serial No. 09813621.1, Response filed Oct. 15, 2012 to Office Action dated Apr. 4, 2012", 9 pgs.
"International Application Serial No. PCT/US2008/010188, International Search Report dated May 26, 2009", 9 pgs.
"International Application Serial No. PCT/US2008/010188, Written Opinion dated May 26, 2009", 10 pgs.
"International Application Serial No. PCT/US2009/056544, International Preliminary Report on Patentability dated Mar. 24, 2011", 6 pgs.
"International Application Serial No. PCT/US2009/056544, Search Report dated Feb. 2, 2010", 3 pgs.
"International Application Serial No. PCT/US2009/056544, Written Opinion dated Feb. 2, 2010", 4 pgs.
"Japanese Application Serial No. 2011-526974, Office Action dated Sep. 9, 2014", 4 pgs.
"Japanese Application Serial No. 2011-526974, Office Action dated Oct. 29, 2013", w/English Translation, 8 pgs.
"Japanese Application Serial No. 2011-526974, Response filed Apr. 18, 2026 to Office Action dated Oct. 29, 2013", w/English Claims, 30 pgs.
"Korean Application Serial No. 10-2011-7007777, Amendment filed Sep. 11, 2014", w/English claims, 29 pgs.
"Singapore Patent Application No. 201001273-0, Letters Patent issued Apr. 29, 2011", 3 pgs.
"Terrazon 3D Stacked Microcontroller with DRAM—FASTACK 3D Super-8051 Micro-controller", [Online]. Retrieved from the Internet: <URL: http://www.tezzaron.com/OtherICs/Super_8051.htm>, (Link sent Oct. 2, 2007), 2 pgs.
"Terrazon 3D Stacked DRAM Bi-STAR Overview", [Online]. Retrieved from the Internet: <URL: http://www.tezzaron.com/memory/Overview_3D_DRAM.htm, (Link sent Oct. 2, 2007), 1 pg.
"Terrazon FaStack Memory—3 D Memory Devices", [Online]. Retrieved from the Internet: <URL: http://www.tezzaron.com/memory/Overview_3D_DRAM.htm, (Link sent Oct. 2, 2007 Downloaded Oct. 27, 2007), 3 pgs.
Black, Bryan, et al., "Die Stacking (3D) Microarchitecture", 6 pages.
Bogatin, Eric, "Origami-Style Structure Simplifies Packaging Efficiency", Semiconductor International, (Feb. 1, 2003), 2 pgs.
Gann, Keith D, "Neo-stacking technology", Irvine Sensors Corporation News Release, (Mar. 2007), 4 pgs.
Gurnett, K, et al., "A look at the future of stacked die integrated circuits", Military and Aerospace Electronics, (Apr. 2003), 3 pgs.
Prophet, Graham, "Multi-chip packaging: tall stacks, low profiles", EDN Europe, (Dec. 5, 2005), 5 pgs.
U.S. Appl. No. 11/847,113, filed Aug. 29, 2007, Memory Device Interface Methods, Apparatus, and Systems, U.S. Pat. No. 7,623,365.
U.S. Appl. No. 12/619,438, filed Nov. 16, 2009, Memory Device Interface Methods, Apparatus, and Systems, U.S. Pat. No. 8,174,859.
U.S. Appl. No. 13/464,565, filed May 4, 2012, Memory Device Interface Methods, Apparatus, and Systems, U.S. Pat. No. 8,339,827.
U.S. Appl. No. 14/066,269, filed Oct. 29, 2013, Memory Device Interface Methods, Apparatus, and Systems, U.S. Pat. No. 9,001,548.
U.S. Appl. No. 13/686,438, filed Nov. 27, 2012, Memory Device Interface Methods, Apparatus, and Systems, U.S. Pat. No. 8,593,849.
U.S. Appl. No. 12/209,052, filed Sep. 11, 2008, Signal Delivery in Stacked Device, U.S. Pat. No. 8,106,520.
U.S. Appl. No. 13/361,183, filed Jan. 30, 2012, Signal Delivery in Stacked Device, U.S. Pat. No. 9,324,690.
U.S. Appl. No. 11/847,113 Notice of Allowance dated Mar. 9, 2009, 8 pgs.
U.S. Appl. No. 11/847,113, Notice of Allowance dated Jul. 14, 2009, 8 pgs.
U.S. Appl. No. 11/847,113, Supplemental Notice of Allowability dated Aug. 13, 2009, 2 Pgs.
U.S. Appl. No. 11/847,113, Supplemental Notice of Allowability dated Sep. 2, 2009, 5 Pgs.
U.S. Appl. No. 12/209,052 Restriction Requirement dated Oct. 15, 2010, 9 pgs.
U.S. Appl. No. 12/209,052, Response filed Nov. 15, 2010 to Restriction Requirement dated Oct. 15, 2010, 10 pgs.
U.S. Appl. No. 12/209,052, Non Final Office Action dated Feb. 4, 2011, 10 pgs.
U.S. Appl. No. 12/209,052, Response filed May 4, 2011 to Non Final Office Action dated Feb. 4, 2011, 12 pgs.
U.S. Appl. No. 12/209,052, Final Office Action dated Jul. 22, 2011, 9 pgs.
U.S. Appl. No. 12/209,052 , Response filed Aug. 31, 2011 to Final Office Action dated Jul. 22, 2011, 10 pgs.
U.S. Appl. No. 12/209,052, Notice of Allowance dated Sep. 21, 2011, 9 pgs.
U.S. Appl. No. 12/619,438, Non Final Office Action dated May 13, 2011, 6 pgs.
U.S. Appl. No. 12/619,438, Response filed Aug. 12, 2011 to Non Final Office Action dated May 13, 2011, 7 pgs.
U.S. Appl. No. 12/619,438, Notice of Allowance dated Sep. 12, 2011, 7 pgs.
U.S. Appl. No. 12/619,438, Notice of Allowance dated Jan. 5, 2012, 7 pgs.
U.S. Appl. No. 13/361,183, Restriction Requirement dated Nov. 14, 2012, 6 pgs.
U.S. Appl. No. 13/361,183, Response filed Dec. 14, 2012 to Restriction Requirement dated Nov. 14, 2012, 5 pgs.
U.S. Appl. No. 13/361,183, Non Final Office Action dated Feb. 13, 2013, 6 pgs.
U.S. Appl. No. 13/361,183, Response filed May 13, 2013 to Non Final Office Action dated Feb. 13, 2013, 7 pgs.
U.S. Appl. No. 13/361,183, Final Office Action dated Aug. 15, 2013, 7 pgs.
U.S. Appl. No. 13/361,183, Response filed Nov. 15, 2013 to Non Final Office Action dated Aug. 15, 2013, 10 pgs.
U.S. Appl. No. 13/361,183, Advisory Action dated Nov. 25, 2013, 3 pgs.
U.S. Appl. No. 13/361,183, Response filed Nov. 27, 2013 to Advisory Action dated Nov. 25, 2013, 9 pgs.
U.S. Appl. No. 13/361,183, Advisory Action dated Dec. 9, 2013, 3 pgs.
U.S. Appl. No. 13/361,183, Response filed Dec. 11, 2013 to Final Office Action dated Aug. 15, 2013 and Advisory Actions dated Nov. 25, 2013 and Dec. 9, 2013, 10 pgs.
U.S. Appl. No. 13/361,183, Advisory Action dated Dec. 30, 2013, 4 pgs.
U.S. Appl. No. 13/361,183, Response filed Jan. 15, 2014 to Final Office Action dated Aug. 15, 2013, 8 pgs.
U.S. Appl. No. 13/361,183, Notice of Non-Compliant Amendment dated Mar. 23, 2014, 4 pgs.
U.S. Appl. No. 13/361,183, Response filed Apr. 28, 2014 to Notice of Non-Compliant Amendment dated Apr. 28, 2014, 9 pgs.
U.S. Appl. No. 13/361,183, Non Final Office Action dated Dec. 4, 2014, 6 pgs.
U.S. Appl. No. 13/361,183, Response filed Feb. 26, 2015 to Non Final Office Action dated Dec. 4, 2014, 6 pgs.
U.S. Appl. No. 13/361,183, Final Office Action dated Jun. 1, 2015, 10 pgs.
U.S. Appl. No. 13/361,183, Response filed Nov. 2, 2015 to Final Office Action dated Jun. 1, 2015, 7 pgs.
U.S. Appl. No. 13/361,183, Advisory Action dated Nov. 10, 2015, 2 pgs.
U.S. Appl. No. 13/361,183 Response filed Nov. 25, 2015 to Final Office Action dated Jun. 1, 2015, 7 pgs.
U.S. Appl. No. 13/361,183, Examiner Interview Summary dated Dec. 1, 2015, 4 pgs.
U.S. Appl. No. 13/361,183, Notice of Allowance dated Dec. 9, 2015, 5 pgs.
U.S. Appl. No. 13/361,183, PTO Response to Rule 312 Communication mailed Mar. 29, 2016, 2 pgs.
U.S. Appl. No. 13/464,565, Notice of Allowance dated Aug. 20, 2012, 8 pgs.

(56) References Cited

OTHER PUBLICATIONS

U.S. Appl. No. 13/686,438, Notice of Allowance dated May 29, 2013, 10 pgs.
U.S. Appl. No. 13/686,438, Supplemental Notice of Allowability dated Oct. 29, 2013, 2 pgs.
U.S. Appl. No. 14/066,269, Notice of Allowance dated Nov. 26, 2014, 10 pgs.
"U.S. Appl. No. 11/847,113 Notice of Allowance dated Mar. 9, 2009", NOAR, 8 pgs.
"U.S. Appl. No. 13/361,183, PTO Response to Rule 312 Communication dated Mar. 29, 2016", 2 pgs.
"European Application Serial No. 08795662.9, Amendment filed May 21, 2010", 9 pgs.
"European Application Serial No. 08795662.9, Office Action dated Aug. 22, 2014", 7 pgs.
"European Application Serial No. 09813621.1, Communication Pursuant to Article 94(3) EPC dated Aug. 19, 2016", 4 pgs.
"European Application Serial No. 09813621.1, Response filed Feb. 28, 2017 to Communication Pursuant to Article 94(3) EPC dated Aug. 19, 2017", 23 pgs.
"International Application Serial No. PCT/US2008/010188, International Preliminary Report on Patentability dated Mar. 11, 2010", 12 pgs.
"International Application Serial No. PCT/US2008/010188, Invitation to Pay Additional Fees and Partial International Search Report dated Mar. 13, 2009", 4 pgs.
"Japanese Application Serial No. 2010-522950, Office Action dated Mar. 5, 2013", w/English translation, 9 pgs.
"Japanese Application Serial No. 2010-522950, Response filed May 30, 2013 to Office Action dated Mar. 5, 2013", w/English claims, 10 pgs.
"Japanese Application Serial No. 2010-522950, Voluntary Amendment filed Apr. 27, 2010", 6 pgs.
"Japanese Application Serial No. 2013-168771, Office Action dated Jun. 3, 2014", w/English translation, 6 pgs.
"Japanese Application Serial No. 2013-168771, Response filed Sep. 3, 2014 to Office Action dated Jun. 3, 2014", W/ English Claims, 7 pgs.
"Korean Applicaiton Serial No. 10-2011-7007777 Response filed Mar. 13, 2015 to Office Action dated Jan. 14, 2015", With the English claims, 34 pgs.
"Korean Application Serial No. 10-2010-7006657, Amendment filed Aug. 27, 2013", w/English claims, 13 pgs.
"Korean Application Serial No. 10-2010-7006657, Office Action dated Sep. 12, 2013", w/English translation, 4 pgs.
"Korean Application Serial No. 10-2010-7006657, Response filed Dec. 12, 2013 to Office Action dated Sep. 12, 2013", w/English Claims, 11 pgs.
"Korean Application Serial No. 10-2013-7033071, Office Action dated Feb. 28, 2014", w/English Translation, 4 pgs.
"Korean Application Serial No. 10-2013-7033071, Response filed Jun. 30, 2014 to Office Action dated Feb. 28, 2014", w/English claims, 10 pgs.
"Singaporean Application Serial No. 201001273-0, Voluntary Amendment filed Jan. 31, 2011", English claims, 5 pgs.
"Taiwan Application Serial No. 097132932, Final Decision of Rejection dated Dec. 18, 2012", w/English claims, 13 pgs.
"Taiwan Application Serial No. 097132932, Office Action dated May 30, 2012", w/English translation, 14 pgs.
"Taiwan Application Serial No. 097132932, Response filed Aug. 21, 2012 to Office Action dated May 30, 2012", w/English claims, 8 pgs.
"Taiwanese Application Serial No. 097132932, Re-Examination Brief filed Jun. 6, 2013", w/English claims and specification, 24 pgs.
"Taiwanese Application Serial No. 098130799 Response filed May 15, 2015 to Office Action dated Mar. 4, 2015", With the English claims, 17 pgs.
"Taiwanese Application Serial No. 098130799, Office Action dated Feb. 12, 2015", W/ English Claims, 9 pgs.

* cited by examiner

SIGNAL DELIVERY IN STACKED DEVICE

PRIORITY APPLICATION

This application is a divisional of U.S. application Ser. No. 13/361,183, filed Jan. 30, 2012, which is a divisional of U.S. application Ser. No. 12/209,052, filed Sep. 11, 2008, now issued as U.S. Pat. No. 8,106,520, all of of which are incorporated herein by reference in their entirety.

BACKGROUND

Computers and other electronic products, e.g., televisions, digital cameras, and cellular phones, often use one or more devices to perform electrical functions. For example, a computer or a cellular phone may use a logic device, such as a processor to perform logic function, and a memory device to store information. The devices may communicate with each other in the form of electrical signals that are delivered among them. As the number of devices in some of these products grows, delivering signals among these devices may pose a challenge.

DETAILED DESCRIPTION

Figure 1:
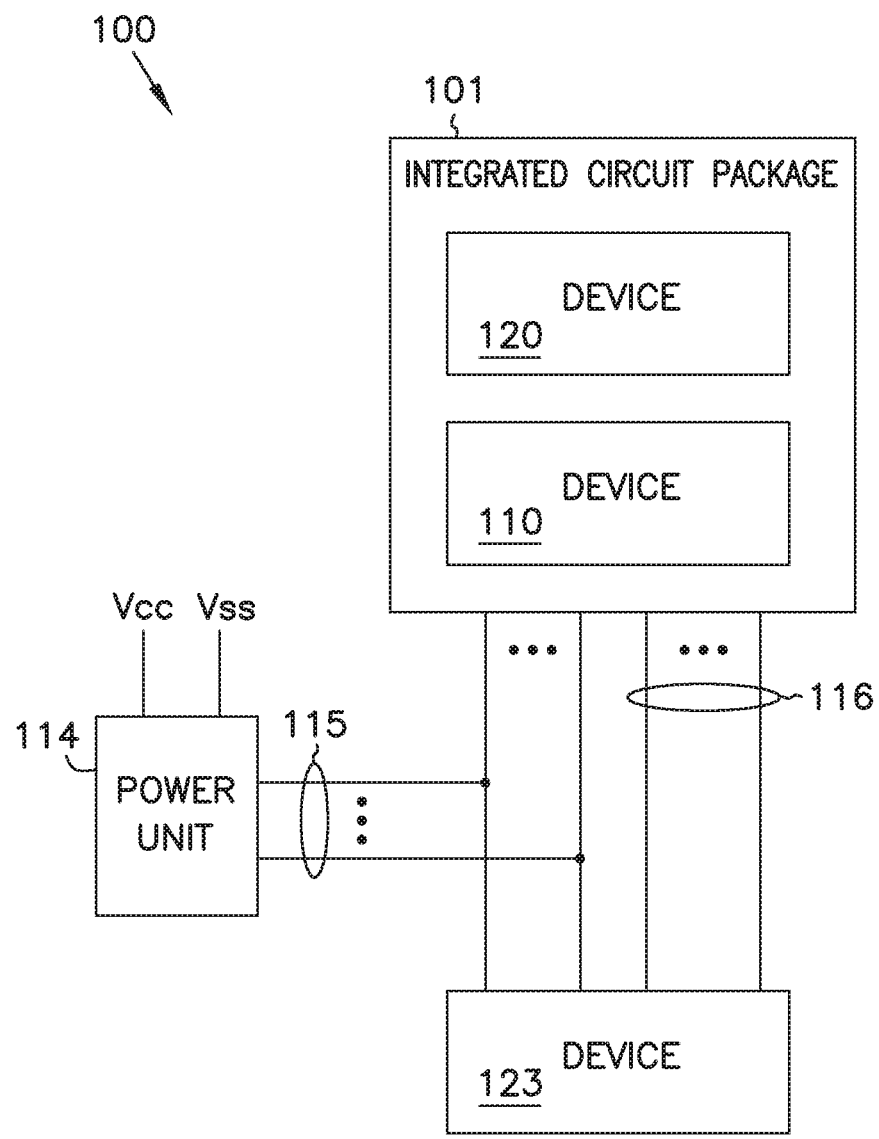
FIG. 1 is a block diagram of an apparatus including an integrated circuit package (IC) according to various embodiments of the invention.

FIG. 1 is a block diagram of an apparatus 100 including an IC package 101 according to various embodiments of the invention. Apparatus 100 may include or be included in a memory device, a processor, a computer, a television, a digital camera, a cellular phone, or another electronic device or system.

Apparatus 100 may include devices 110, 120, and 123 where one or more devices, e.g., devices 110 and 120, may be included within the same IC package, such as IC package 101. Each of devices, 110, 120, and 123 may include circuitry to perform one or more functions such as a storing function (e.g., function of a memory device) and logic function (e.g., function of a processor). IC package 101 may include both storing and logic functions and device 110 such that device 110 may include memory device and device 120 may include a logic device (e.g., a general-purpose processor, an application specific integrated circuit (ASIC), or a microcontroller).

Apparatus 100 also may include a power unit 114 to receive power (e.g., power signals Vcc and Vss) from a source such as a battery or an alternating current-direct current (AC-DC) power source. Power unit 114 may provide power to IC package 101 and device 123 through lines 115.

IC package 101 may exchange information with device 123 through lines 116. Thus, information transferred to and from IC package 101 may include power signals on lines 115 and other signals such as data, address, clock, and control on lines 116.

IC package 101 may include an IC package described below with reference to FIG. 2 through FIG. 10.

Figure 2:
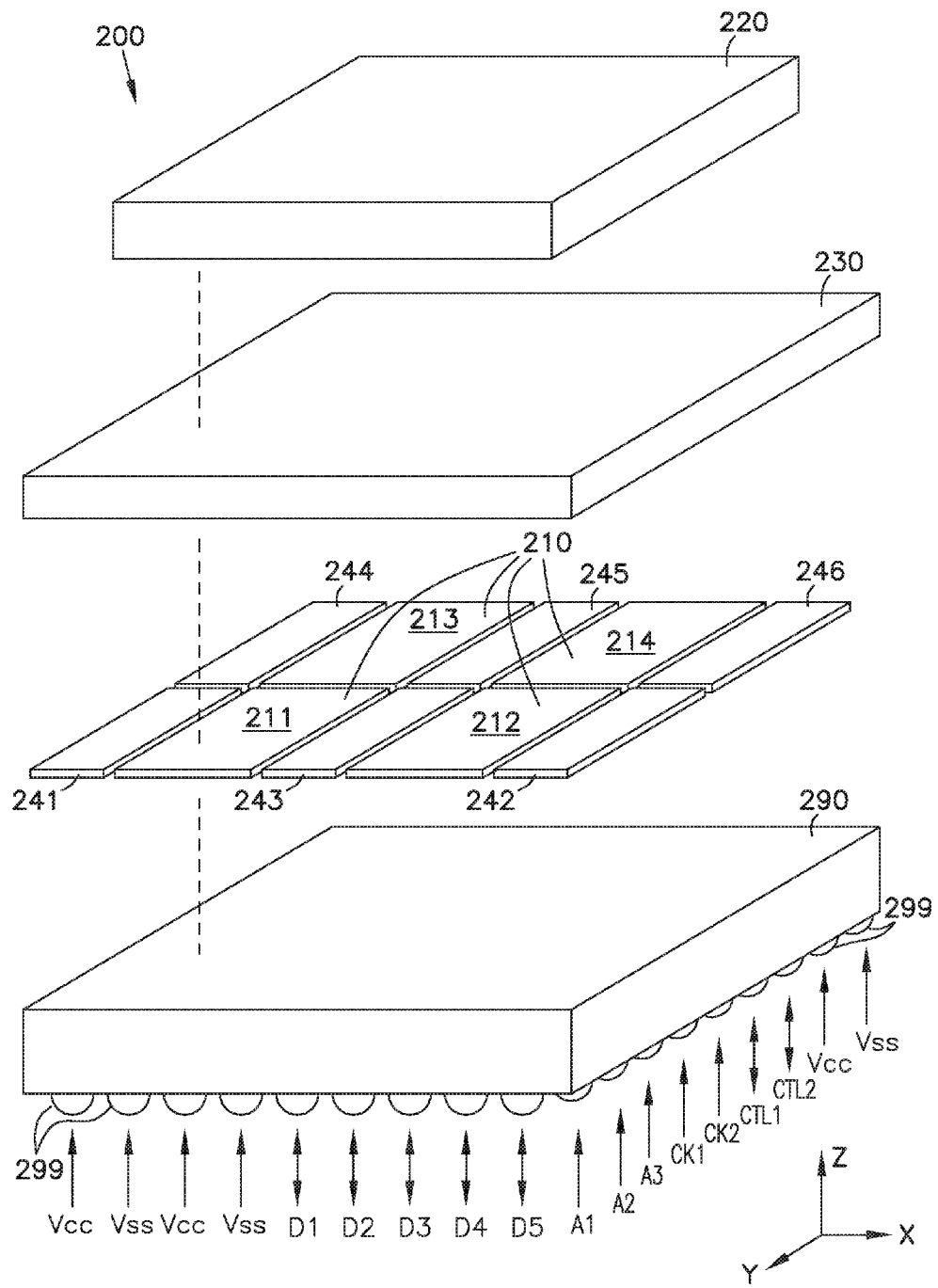
FIG. 2 shows an exploded view of some components of an IC package according to various embodiments of the invention.

FIG. 2 shows an exploded view of some components of an IC package 200 according to various embodiments of the invention. IC package 200 may include a device 210 having separate dice 211, 212, 213, and 214, a device 220, and a base 290. IC package 200 may also have a structure that includes interposer 230 and structure portions 241, 242, 243, 244, 245, and 246. Some components of IC package 200 such as devices 210 and 220 may be represented in schematic block diagram similar to or identical to the block diagram of devices 110 and 120 of IC package 101 of FIG. 1.

The components of IC package 200, including base 290, devices 210 and 220, interposer 230, and structure portions 241 through 246, may be arranged in a stack in the z-dimension after they are attached to each other. Soldering or other attachment techniques may be used to attach the components of IC package 200 to each other.

Each of dice 211, 212, 213, and 214 of device 210 may include a semiconductor-based material (e.g., silicon) where electrical circuit components are located. Dice 211, 212, 213, and 214 may be formed from a silicon wafer. Device 220 may also include one or more dice where electrical circuit components of device 220 are located. The material of the die (or dice) of device may be similar to that of the dice of device 210.

Interposer 230 and structure portions 241 through 246 may include material identical to or different from the material of dice 211, 212, 213, and 214. Base 290 may include conductive elements (e.g., solder balls) 299 arranged in a grid pattern in the x-dimension and y-dimension, and conductive paths going through base 290 to transfer information to and from IC package 200. Base 290 may include an inorganic (e.g., ceramic) substrate or an organic substrate. An example of an organic substrate includes a multi-layer bismaleimide triazine (BT) substrate. FIG. 2 shows conductive elements 299 having ball shape as an example. Conductive elements 299, however, may include other shapes such as pin shape, rectangular shape, and others.

IC package 200 may communicate with other devices using signals transferred to and from conductive elements 299 of base 290. As shown in FIG. 2, the signals may include power signals Vcc and Vss, data signals D1, D2, D3, D4, and D5, address signals A1, A2, and A3, clock signals CK1 and CK2, and control signals CTL1 and CTL2. Vcc signals include signals having a positive voltage value. Vss signals include signals having a zero voltage value or ground potential value. FIG. 2 associates some of the signals (e.g., D1 through D5, and CTL1 and CTL2) with 2-way arrows to indicate that these signals may be transferred either from IC package 200 or to IC package 200.

IC package 200 may use interposer 230 and structure portions 241 through 246 to transfer at least one subset of the signals between base 290 and one or both of devices 210 and 220. A subset of the signals includes only one signal or a group of signals among the signals. At least a subset of the signals, as described in this specification, means only one, or some, or all of the signals. In FIG. 2, a subset of the signals includes one or more of the power signals, one or more of the data signals, one or more of the address signals, one or more of the clock signals, one or more of the control signals, or a combination of these signals. A subset of the signals may also include one or more of only the power signals, one or more of only the data signals, one or more of only the address signals, one or more of only the clock signals, or one or more of only the control signals. For example, IC package 200 may use interposer 230 and structure portions 241 through 246 to transfer one or more of only the power signals (e.g., only Vcc and Vss signals) from base 290 to device 220. In another example, IC package 200 may transfer at least one subset of the signals from base 290 to device 210 and from device 210 to device 220. In another example, IC package 200 may transfer at least one subset of the signals (e.g., data signals) from base 290 to device 210, from device 210 to interposer 230, and then from the interposer to device 220.

Figure 3:
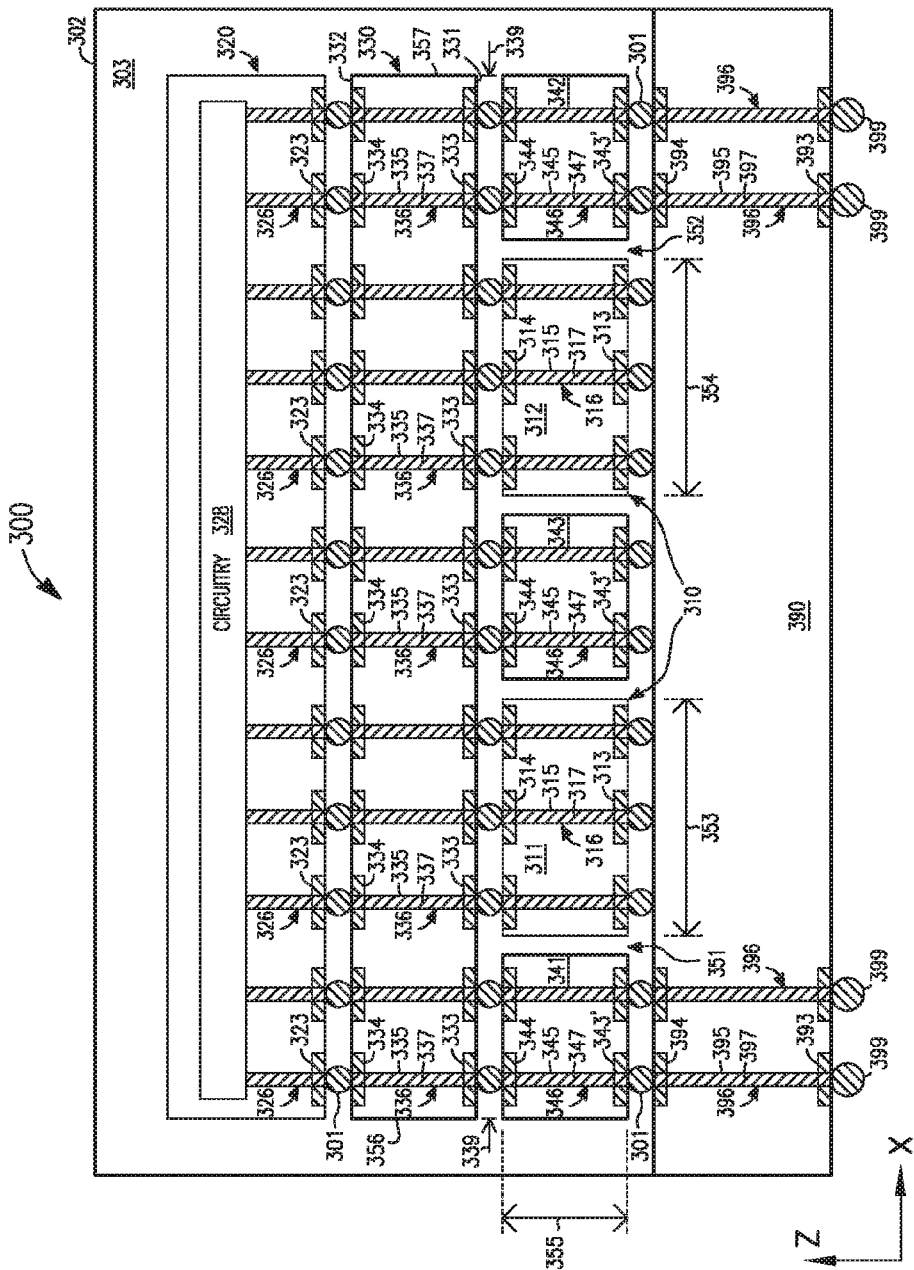
FIG. 3 shows a partial cross-section of an IC package having devices and an interposer, according to various embodiments of the invention.

FIG. 3 shows a partial cross-section of an IC package 300 having devices 310 and 320 and an interposer 330, according to various embodiments of the invention. IC package 300 may also include a base 390 having conductive elements 399 to transfer information to and from IC package 300. IC package 300 may use a structure that includes interposer 330 and structure portions 341, 342, and 343 to transfer signals between base 390 and or both of devices 310 and 320. As shown in FIG. 3, base 390, devices 310 and 320, and interposer 330 are arranged in a stack in the z-dimension and attached to each other by conductive joints 301 (e.g., solder, copper, or other materials). IC package 300 may include an enclosure 302 and an interior 303, which may be filled with insulation material such as epoxy-based molding compound. The components of IC package 300, such as devices 310 and 320, interposer 330, and structure portions 341, 342, and 343, may be enclosed inside enclosure 302.

Base 390 may include functions and material similar to or identical to base 290 of FIG. 2. As shown in FIG. 3, base 390 may include conductive contacts 393 and 394 and vias (some times called through-hole) 395 extending through base 390 and coupled to conductive contacts 393 and 394. Base 390 may also include conductive paths 396 going through it. Conductive paths 396 may include conductive material 397 located inside vias 395 to provide electrical connections between conductive contacts 393 and 394. FIG. 3 shows four conductive paths 396 in base 390 for simplicity. Base 390, however, may include numerous conductive paths similar to or identical to conductive paths 396. Base 390 may include passive components such as resistors, inductors, and capacitors to perform function such as power signal filtering, these components are omitted from FIG. 3 to help focus on the embodiments described herein.

Device 310 may include functions and material similar to or identical to device 110 of FIG. 1 or device 210 of and FIG. 2. As shown in FIG. 3, device 310 may include multiple dice such as dice 311 and 312 located side by side with each of other in the x-dimension and on the same stack level in the z-dimension, which is perpendicular to x-dimension. Each of dice 311 and 312 may include conductive contacts 313 and 314 located at opposite surfaces of the die and vias 315 extending through the die and coupled to conductive contacts 313 and 314. Each of dice 311 and 312 may also include conductive paths 316 going through the die. Conductive paths 316 may include conductive material 317 inside vias 315. Each of dice 311 and 312 may also include additional conductive paths (not shown in FIG. 3) to transfer signals between base 390 and device 320. The additional conductive paths may not go through vias that extend through the die. Device 310 may include a memory device where each of dice 311 and 312 may include other components, such as memory cells and related circuitry, which are omitted from FIG. 3 to help focus on the embodiments described herein.

As shown in FIG. 3, structure portion 341 may be located at a side 351 of device 310, structure portion 342 may be located at a side 352 of device 310, and structure portion 343 may be located between dice 311 and 312 of device 310. Each of structure portions 341, 342, and 343 may include conductive contacts 343 and 344 located at opposite surfaces of the structure portion and vias 345 extending through the structure portion and coupled to conductive contacts 343 and 344. Each of structure portions 341, 342, and 343 may also include conductive paths 346 going through the structure portion. Conductive paths 346 may include conductive material 347 inside vias 345. As shown in FIG. 3, device 310 and structure portions 341, 342, and 343 have an equal height 355 in the z-dimension. FIG. 3 shows two conductive paths 346 in each of structure portions 341, 342, and 343 for simplicity. Each of structure portions 341, 342, and 343, however, may include numerous conductive paths similar to or identical to conductive paths 346.

Device 320 may include functions and material similar to or identical to device 120 of FIG. 1 or device 220 of FIG. 2. In FIG. 3, device 320 may include conductive contacts 323 and conductive paths 326 coupled to conductive contacts 323 to provide electrical connection to circuitry 328, which is shown as block diagram. Circuitry 328 may include components configured to perform functions, e.g., logic functions, similar to or identical to device 120 of FIG. 1.

Interposer 330 in FIG. 3 includes opposite surfaces 331 and 332, conductive contacts 333 located at surface 331, conductive contacts 334 located at surface 332 and vias 335 extending from surface 331 to surface 332 and coupled to conductive contacts 333 and 334. Interposer 330 may also include conductive paths 336 going through it. Conductive paths 336 may include conductive material 337 inside vias 335. Interposer 330 may also include additional conductive paths (not shown in FIG. 3) to transfer signals between base 390 and device 320 or between device 310 and device 320. The additional conductive paths of interposer 320 may not go through vias that extend from surface 331 to surface 332 of interposer 330. Interposer 330 may include multiple layers in the z-dimension that are electrically separated from each other. Each of the multiple layers may include a conductive material to transfer a different type of signal. For example, interposer 330 may include three layers in which a first layer may transfer power signals with positive voltage value (e.g., Vcc), a second layer may transfer power signal with a ground potential value (e.g., Vss), and a third layer may transfer data or other type of signals.

Interposer 330 has a length 339 measured between edges 356 and 357. Length 339 may be greater than a length 353 of die 311, greater than a length 354 of die 312, and greater than the sum of lengths 353 and 354. As shown in FIG. 3, interposer 330 with a greater length than device 310 allows it to couple to base 390 through not only device 310 and structure portion 343 but also through structure portions 341 and 342. The signal delivery structure in IC package 300, which includes interposer 330 and structure portions 341, 342, and 343, may improve signal delivery in IC package 300. For example, power signals received at base 390 may be more uniformly distributed from base 390 to device 320. IC package 300 may omit the structure that includes interposer 330 and structure portions 341, 342, and 343, and transfer some or all of the power signals from base 390 to device 310 and then from device 310 to device 320. However, in some cases, omitting interposer 330 may reduce the uniformity of signal distribution (e.g., distribution of power signals) from base 390 to device 320.

FIG. 3 shows an example where devices 310 and 320, interposer 330, and structure portions 341, 342, and 343 are physically separated from each other. However, one or both of structure portions 341 and 343 may be incorporated into the same die, such as die 311, or one or both of structure portions 342 and 343 may be incorporated into the same die such as die 312. FIG. 3 shows also an example where device 310 includes dice 311 and 312 that are physically separated from each other in the x-dimension. Device 320, however, may include only a single die in the x-dimension. With a single die, one or more of structure portions 341, 342, and 343 may be incorporated into the single die or may be omitted from IC package 300. For example, with the single die, structure portion 341 may be incorporated into the single die or may be omitted from IC package 300 and structure portions 341 and 342 may remain separated from the single die or may be incorporated into the single die. In short, at least one of interposer 330 and structure portions 341, 342, and 343 may be physically separated from the die or dice of device 310 such that at least one of interposer 330, and structure portions 341, 342, and 343 may be located outside the die or dice of the device 310, device 320, or both but inside enclosure 302 of IC package 300.

FIG. 3 shows an example of IC package 300 with device 310 having dice, such as dice 311 and 312, located on one stack level in the z-dimension. Device 320, however, may include a stack of dice in the z-dimension.

Figure 4:
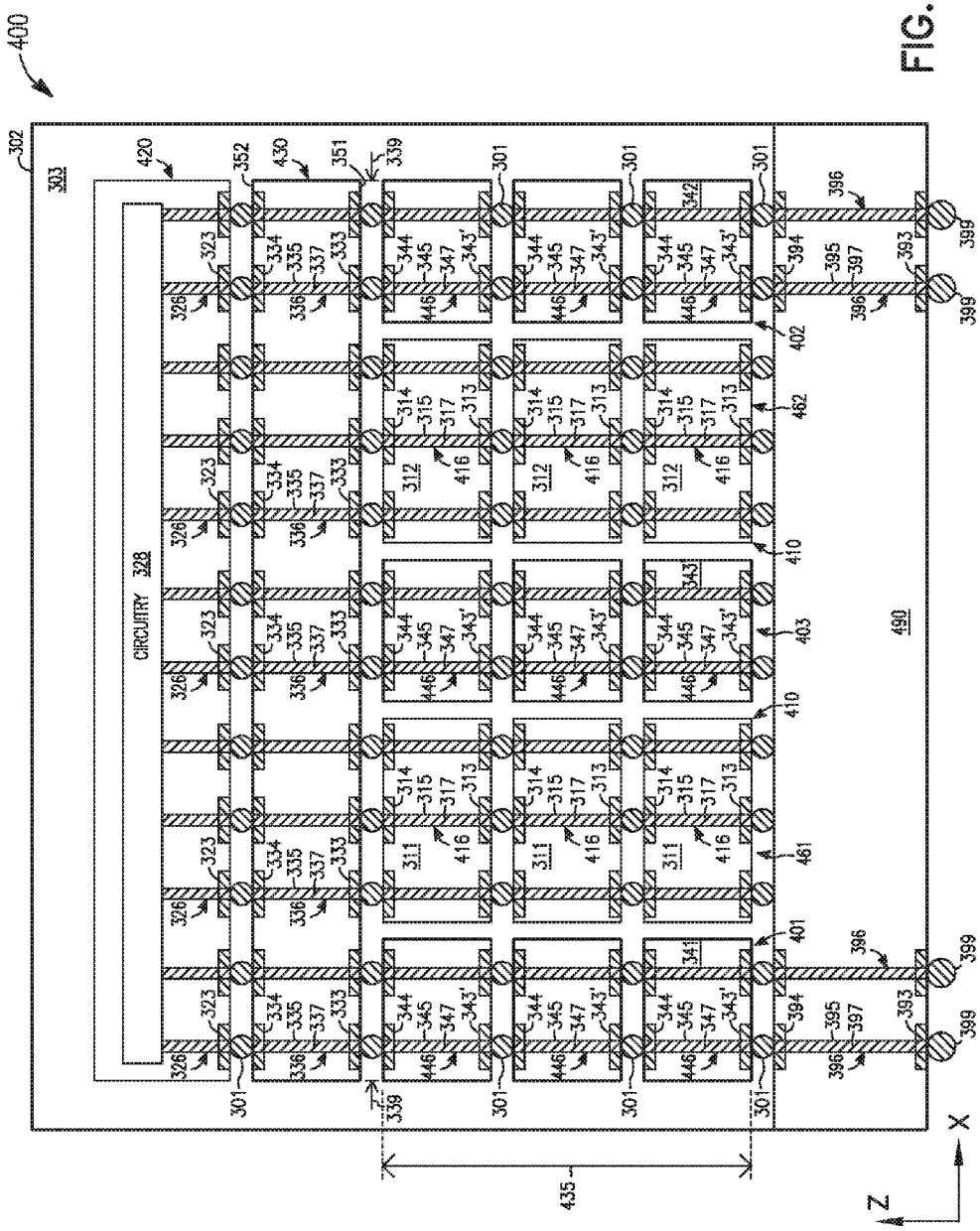
FIG. 4 shows a partial cross-section of an IC package having devices and an interposer with one of the devices including a stack of dice, according to various embodiments of the invention.

FIG. 4 shows a partial cross-section of an IC package 400 having devices 410 and 420 and an interposer 430 and with device 410 including a stack of dice, according to various embodiments of the invention. IC package 400 may include components similar to the components of IC package 300, except for device 410 and stacks of structure portions 401, 402, and 403 of FIG. 4. Thus, for simplicity, similar features between FIG. 3 and FIG. 4 have the same reference labels and are omitted from the description of FIG. 4. As shown in FIG. 4, device 410 may include a stack of dice 461 and a stack of dice 462 arranged side by side with each other in the x-dimension, which is perpendicular to the z-dimension between the base 390 and second device 420. Device 410 may include conductive paths 416 going through stack of dice 461 and stack of dice 462 to transfer information to and from stack of dice 461 and stack of dice 462. Each of stacks of structure portions 401, 402, and 403 may include multiple structures arranged in a stack as shown in FIG. 4 and conductive paths 446 going through the stack to provide electrical communication between base 490 and interposer 430. As shown in FIG. 4, device 410 and stacks of structure portions 401, 402, and 403 have the same height 435.

Figure 5:
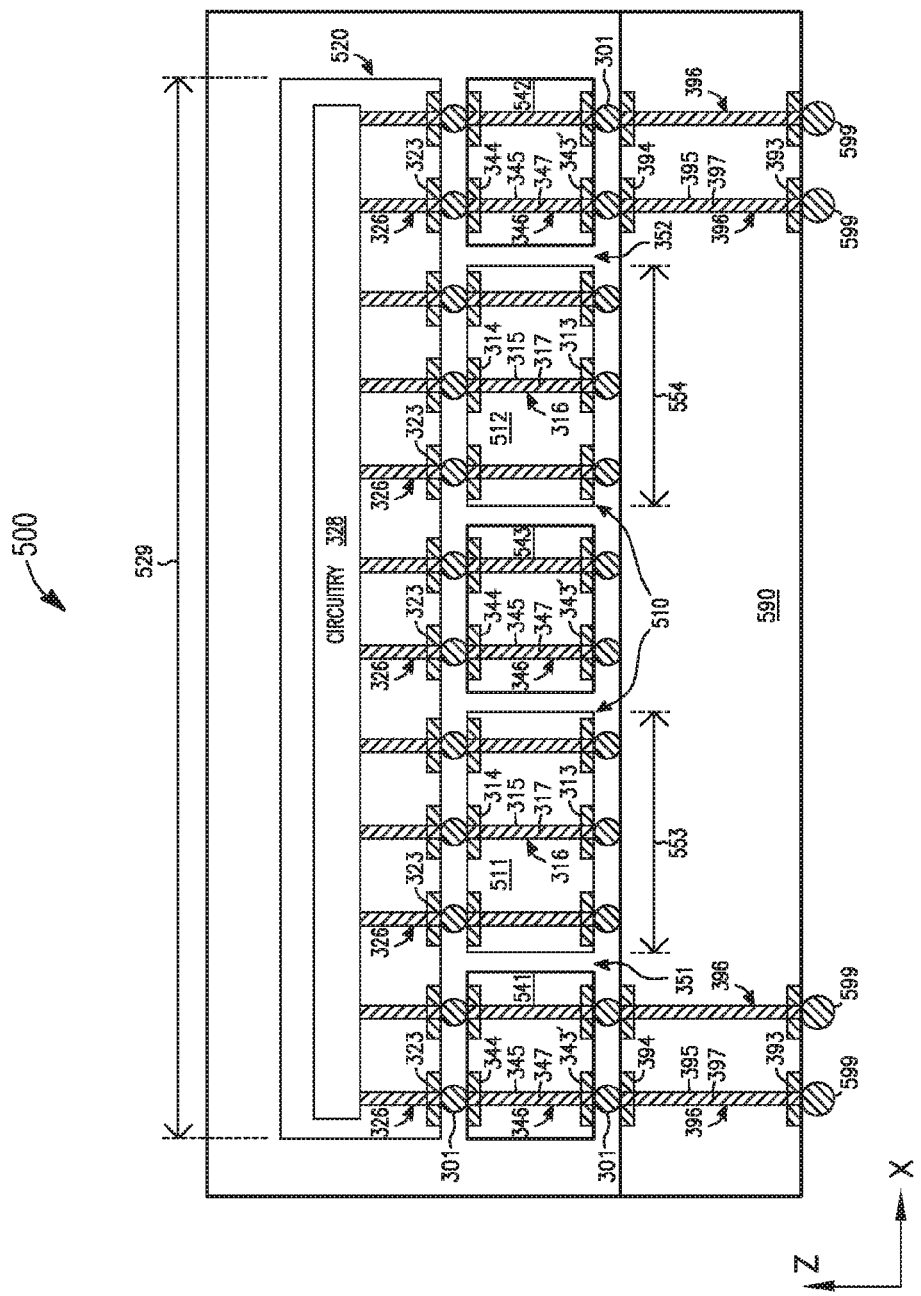
FIG. 5 shows a partial cross-section of an IC package having devices without an interposer, according to various embodiments of the invention.

FIG. 5 shows a partial cross-section of an IC package 500 having devices 510 and 520 without an interposer, according to various embodiments of the invention. IC package 500 may include components similar to the components of IC package 300 of FIG. 3 but without an interposer such as interposer 430 of FIG. 3. For simplicity, similar features between FIG. 3 and FIG. 5 have the same reference labels and are omitted from the description of FIG. 5. Since IC package 500 is without an interposer, device 510 and structure portions 541, 542, and 543 may be directly connected to a base 590 and device 520. Device 520 has a length 529, die 511 has a length 553 of die 511, and die 512 has a length 554. As shown in FIG. 5, length 529 may be greater than length 553, greater length 554, and greater than the sum of lengths 553 and 554, so that structure portions 541 and 542 may be coupled directly be coupled directly to base 590 and device 520 (coupled around device 510). IC package 500 may use structure portions 541, 542, and 542 to transfer at least one subset of the signals received at conductive elements 599 of base 590 to device 520.

Figure 6:
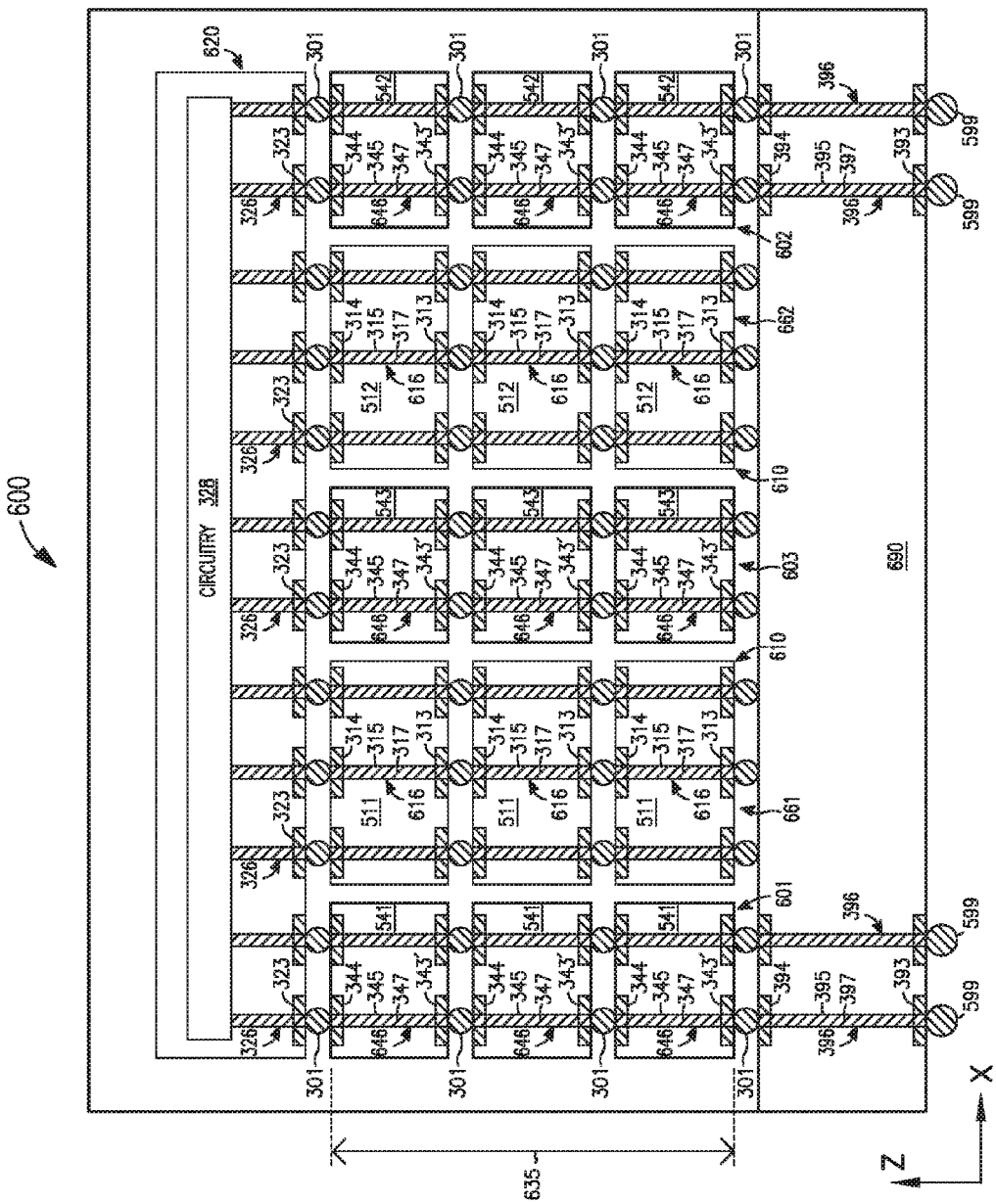
FIG. 6 shows a partial cross-section of an IC package having devices without an interposer and with one of the devices including a stack of dice, according to various embodiments of the invention.

FIG. 6 shows a partial cross-section of an IC package 600 having devices 610 and 620 without an interposer and with device 610 including a stack of dice, according to various embodiments of the invention. IC package 600 may include components similar to the components of IC package 500, except for device 610 and structure portions 601, 602, and 603 of FIG. 6. Thus, for simplicity, similar features between FIG. 5 and FIG. 6 have the same reference labels and are omitted from the description of FIG. 6. As shown in FIG. 6, device 610 may include a stack of dice 661 and a stack of dice 662 arranged side by side with each other in the x-dimension. Device 620 may include conductive paths 616 going through stack of dice 661 and stack of dice 662 to transfer information to and from stack of dice 661 and stack of dice 662. Each of stacks of structure portions 601, 602, and 603 may include multiple structures arranged in a stack as shown in FIG. 6 and conductive paths 646 going through the stack to provide electrical communication between base 690 and device 620. As shown in FIG. 6, device 610 and structure portions 601, 602, and 603 have the same height 635.

Figure 7:
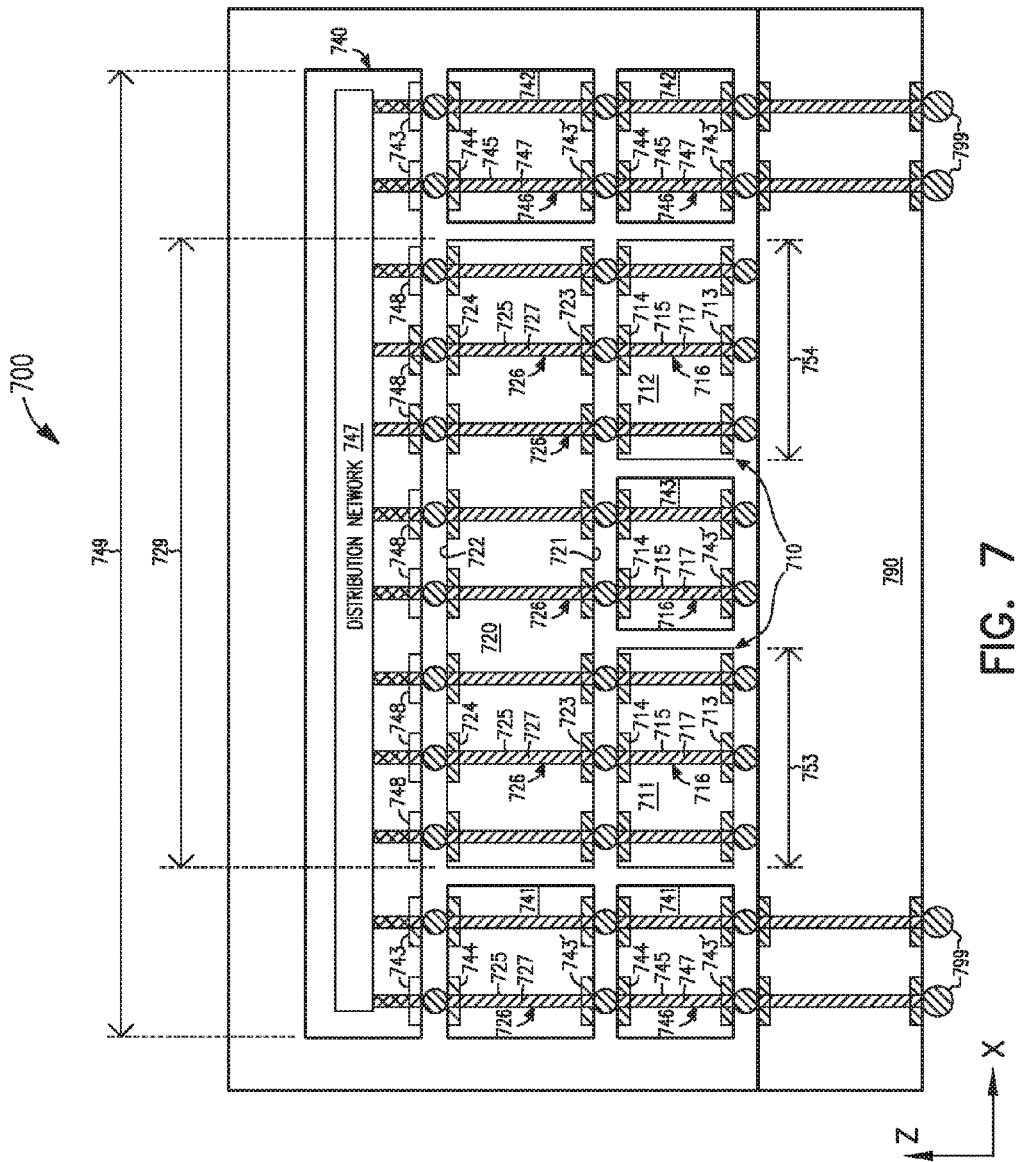
FIG. 7 shows a partial cross-section of an IC package having devices and a structure to transfer signals to a top side of one of the devices, according to various embodiments of the invention.

FIG. 7 shows a partial cross-section of an IC package 700 having devices 710 and 720 and a structure to transfer signals to device 720 from a top side of device 720, according to various embodiments of the invention. IC package 700 may include structure portions 740, 741, 742, and 743 that form a structure to transfer at least one subset of the signals received at conductive elements 799 of a base 790 to device 720. Base 790 may include components similar to or identical to those of base 290, 390, 490, 590, and 690 of FIG. 2 through FIG. 6. In some variations, structure portion 743 may be omitted from IC package 700. Device 710 may include components such as conductive contacts 713 and 714, vias 715, conductive paths 716, and conductive material 717, which are similar to or identical to respective conductive contacts 713 and 314, vias 315, conductive paths 316, and conductive material 317 of device 310 of FIG. 3 or similar to or identical to conductive contacts 513 and 514, vias 515, and conductive paths 516, and conductive material 517 of device 510 of FIG. 5.

In FIG. 7, device 720 may include function similar to or identical to device 220, 320, 420, 520, and 620 of FIG. 2, FIG. 3, FIG. 4, FIG. 5, and FIG. 6, respectively. However, as shown in FIG. 7, device 720 may include conductive contacts 724 located at a surface 722 (at the top side of device 720) to receive signals from structure portion 740. Device 720 may also include conductive contacts 723 located at a surface 721, opposite from surface 722, (e.g., surface at the bottom side of device 720) and vias 725 extending from surface 721 to surface 722 and coupled to conductive contacts 723 and 724. Device 720 may also include conductive paths 726 going through it. Conductive paths 726 may include conductive material 727 inside vias 725.

Structure portions 741, 742, and 743 may include components such as conductive contacts 743 and 744, vias 745, conductive paths 746, and conductive material 747, which are similar to or identical to conductive contacts 743 and 744, vias 745, conductive paths 746, and conductive material 747. Structure portions 741 and 742 may transfer at least a portion of the signals from a base 790 to conductive contacts 743 of structure portion 740. Structure portion 740 may include a distribution network 747, which may include one or more layers of conductive lines coupled between conductive contacts 743 and 748 to allow transfer of signals from conductive contacts 743 to conductive contacts 748, and then from conductive contacts 748 to device 720.

Structure portion 740 has a length 749 and device 720 has a length 729. As shown in FIG. 7, length 749 may be greater than length 729, so that structure portions 741 and 742 may be coupled directly to base 790 and structure portion 740 (coupled around devices 710 and 720). Die 711 has a length 753, and die 712 has a length 754. As shown in FIG. 7, length 729 of device 720 may be greater than length 753, greater length 754, and greater than the sum of lengths 753 and 754, so that structure portion 743 may be coupled directly between base 790 and device 720 (coupled around device 710).

Figure 8:
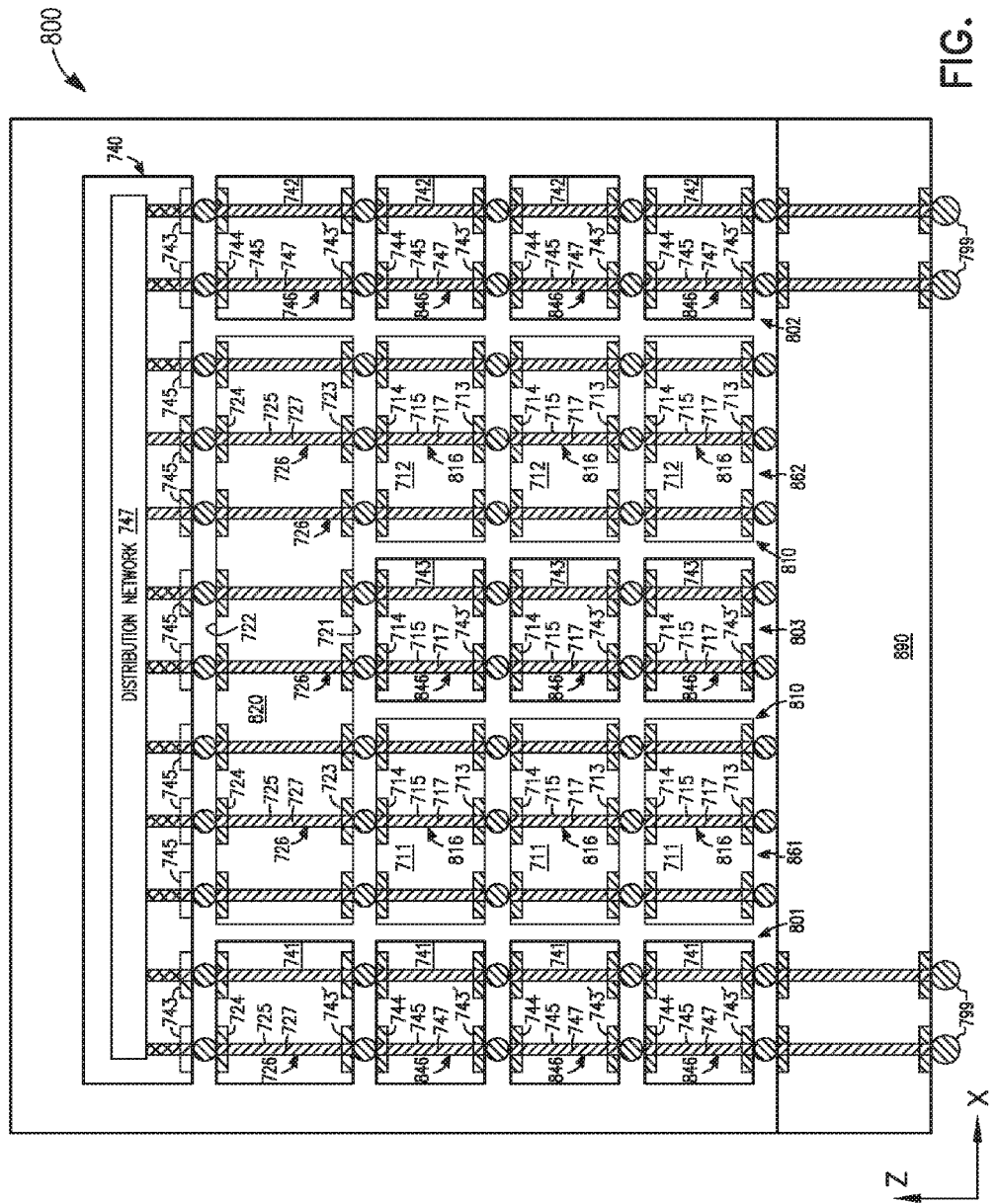
FIG. 8 shows a partial cross-section of an IC package having devices with one of the devices including a stack of dice, according to various embodiments of the invention.

FIG. 8 shows a partial cross-section of an IC package 800 having devices 810 and 820 with device 820 including a stack of dice, according to various embodiments of the invention. IC package 800 may include components similar to the components of IC package 700, except for device 810 and stacks of structure portions 801, 802, and 803 of FIG. 8. Thus, for simplicity, similar features between FIG. 7 and FIG. 8 have the same reference labels and are omitted from the description of FIG. 8. As shown in FIG. 8, device 810 may include a stack of dice 861 and a stack of dice 862 arranged side by side with each other in the x-dimension. Device 810 may include conductive paths 816 going through stack of dice 861 and stack of dice 862 to transfer information to and from stack of dice 861 and stack of dice 862. Each of stacks of structure portions 801, 802, and 803 may also conductive paths 846 going through the stack to provide electrical communication between base 890 and device 820. In some variations, stack 803 may be omitted IC package 800.

Figure 9:
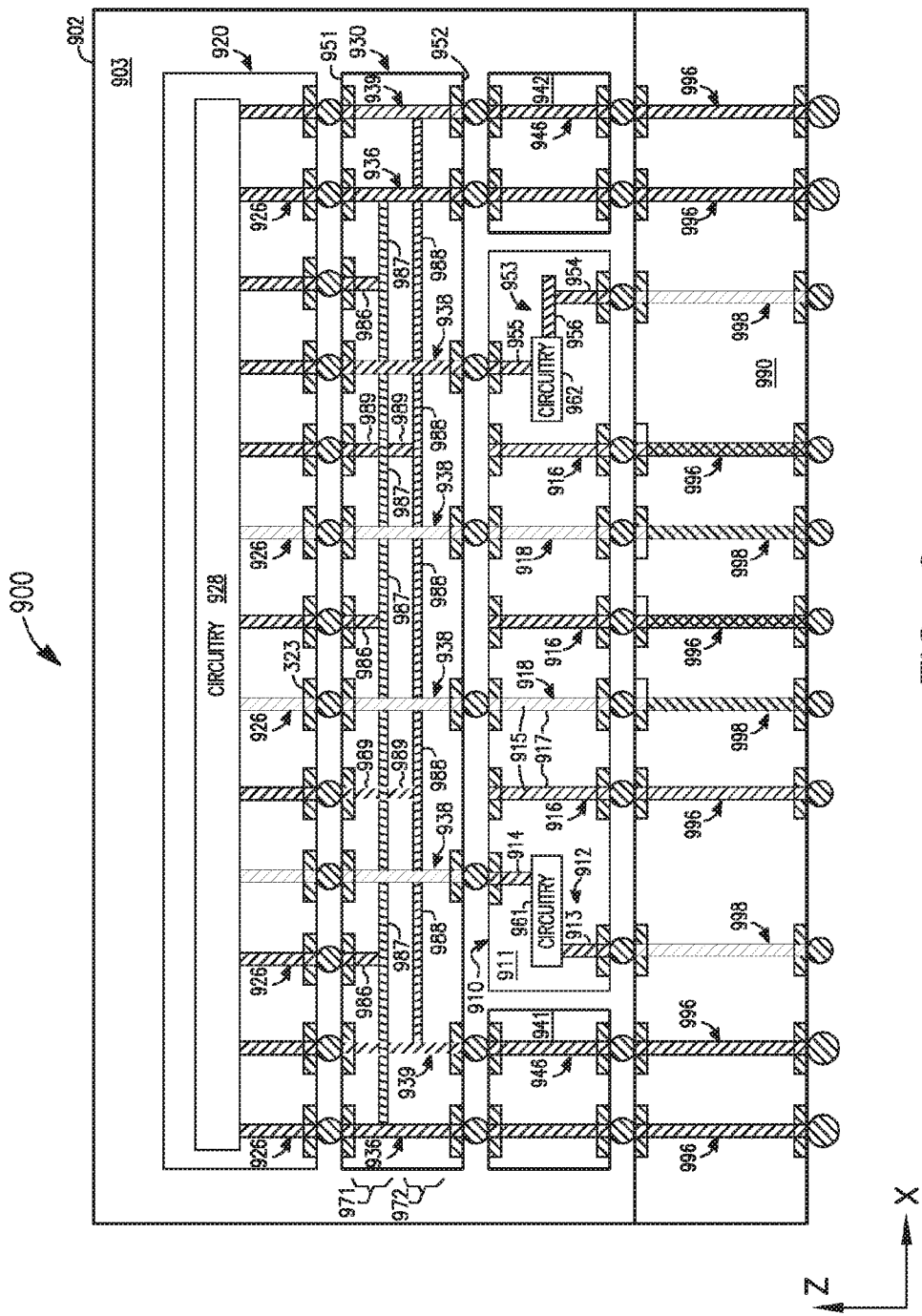
FIG. 9 shows a partial cross-section of an IC package having devices and an interposer with multiple layers, according to various embodiments of the invention

FIG. 9 shows a partial cross-section of an IC package 900 having devices 910 and 920 and an interposer 930 with multiple layers 971 and 972, according to various embodiments of the invention. IC package 900 may include some components that are similar to the components of IC package 300 of FIG. 3. Thus, for simplicity, similar features between FIG. 3 and FIG. 9 are omitted from the description of FIG. 9. For examples, conductive paths 926 and 936 of FIG. 9 may be similar to conductive paths 326 and 336, respectively, of FIG. 3.

In FIG. 9, IC package 900 may use a structure that includes interposer 930 and structure portions 941 and 942 to transfer signals between base 990 and one or both of devices 910 and 920. As shown in FIG. 9, structure portion 941 may be located at one side of device 910, and structure portion 942 may be located at another side of device 910. IC package 900 may use conductive paths 946 of structure portions 941 and 942 to transfer power signals from base 990 to interposer 930. Base 990 may include conductive paths 996 to transfer power signals to devices 910 and 920, and conductive paths 998 to transfer signals such as data and other information to and from devices 910 and 920.

Device 920 may include functions and material similar to or identical to device 120 of FIG. 1, device 220 of FIG. 2, and device 300 of FIG. 3. For example, device 920 may include circuitry 928, which may include components configured to perform functions, e.g., logic functions, similar to or identical to device 120 of FIG. 1.

Device 910 may include functions and material similar to or identical to device 110 of FIG. 1 or device 210 of and FIG. 2. Device 910 of FIG. 9 may include conductive paths 916 coupled to conductive paths 996 of base 990 to receive power signals and conductive paths 918 coupled to conductive paths 998 of base 990 to transfer other signals such as data, address, and/or control signals. Each of conductive paths 916 and 918 may include a conductive material 917 inside vias 915.

Device 910 may include a conductive path 912 coupled to one of conductive paths 998 of base 990 to transfer signal, such as data signal. Conductive path 912 may include vias 913 and 914 and at least a portion of circuitry 961. As shown in FIG. 9, each of vias 913 and 914 may only partly extend through die 911 of device 910. Circuitry 961 may process or manipulate the signal that is transfer on conductive path 912.

Device 910 may also include a conductive path 953 coupled to one of conductive paths 998 of base 990 to transfer signal, such as data signal. Conductive path 953 may include vias 954 and 955, a conductive segment 956, and at least a portion of circuitry 962. As shown in FIG. 9, each of vias 954 and 955 may only partly extend through die 911 of device 910. Conductive segment 956 may extend laterally along the x-dimension and perpendicularly to vias 954 and 955. Circuitry 962 may process or manipulate the signal that is transfer on conductive path 953.

FIG. 9 shows IC package 900 with device 910 having only one die 911 located between base 990 and device 920 as an example. Device 910, however, may include multiple dice arranged in the x-dimension similar to that of device 310 of FIG. 3. Device 910 may also include multiple dice arranged in the z-dimension similar to that of device 410 of FIG. 4. FIG. 9 shows certain number conductive paths in the components of IC 900 as an example. The number of conductive paths in IC 900 may vary.

Interposer 930 in FIG. 9 may include different conductive paths 936, 998, and 399 to transfer different signals. For example, conductive paths 936 may transfer power signals with positive voltage value (e.g., Vcc) to device 920 and conductive paths 939 may transfer power signals with a ground potential value (e.g., Vss) to device 920. Conductive paths 938 may transfer data or other type of signals between device 910 and 920. In FIG. 9, conductive paths 938 are physically and electrically separated from conductive portions 988 and 989. Vias 986 and conductive portions 987 of conductive paths 936 are connected together. Vias 989 and conductive portions 988 of conductive paths 939 are connected together but are physically and electrically separated from vias 986 and conductive portions 987 of conductive paths 936.

As shown in FIG. 9, some of conductive paths 936 and 939 of interposer 930 may not go through vias that extend from surface 951 to surface 952 of interposer 930. For example, some of conductive paths 936 may partly go through interposer 930 in vias 986 and coupled to conductive portions 987. Vias 986 may only extend partly through interposer 930 from surface 951 to conductive portions 987, which extend laterally in the x-dimension in layer 971 of interposer 930. In another example, some of conductive paths 939 may partly go through interposer 930 in vias 989 and coupled to conductive portions 988. Vias 989 may only extend partly through interposer 930 from surface 952 to conductive portions 988, which extend laterally in the x-dimension in layer 972 of interposer 930.

In the apparatus described above with reference to FIG. 1 through FIG. 9, different vias may have different size, e.g., different cross-sections taken in the x-dimension, to transfer different types of signals. For example, vias that transfer power signals may have a greater size than vias that transfer data signals.

Figure 10:
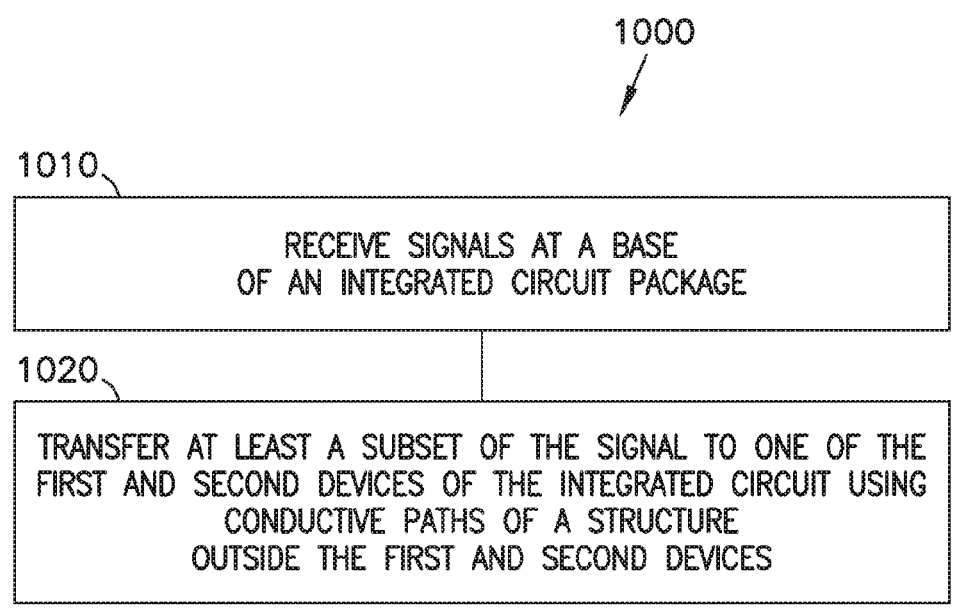
FIG. 10 is a flowchart showing a method of transferring signals in an IC package according to various embodiments of the invention.

FIG. 10 is a flowchart showing a method 1000 of transferring signals in an IC package according to various embodiments of the invention. Method 1000 may be used in an apparatus and an IC package similar or identical to apparatus 100 and IC packages 101, 200, 300, 400, 500, 600, 700, 800, and 900 described above with reference to FIG. 1 through FIG. 9. Thus, the components of apparatus and devices used in method 1000 may include the components of apparatus 100 and IC packages 101, 200, 300, 400, 500, 600, 700, 800, and 900 described above with reference to FIG. 1 through FIG. 9.

Activity 1010 of method 1000 may include receiving signals at a base of an IC package. The IC package may include a first device and a second device arranged in a stack with the first device and the base. The first device may include at least one conductive path through it. Activity 1020 may include transferring at least one subset of the signals from the base to the second device using conductive paths of a structure in the stack. At least a portion of the structure may be located outside the first device and the second device. At least a portion of the conductive paths of the structure go through vias of the structure. The subset of the signals may include power signals, data signals, address signals, clock signals, or control signals, or a combination of these signals. Alternatively, the subset of the signals may include only power signals, e.g., only Vcc and Vss signals. Method 1000 may include other activities similar to or identical to the activities of transferring signals described above with reference to FIG. 1 through FIG. 9.

Figure 11:
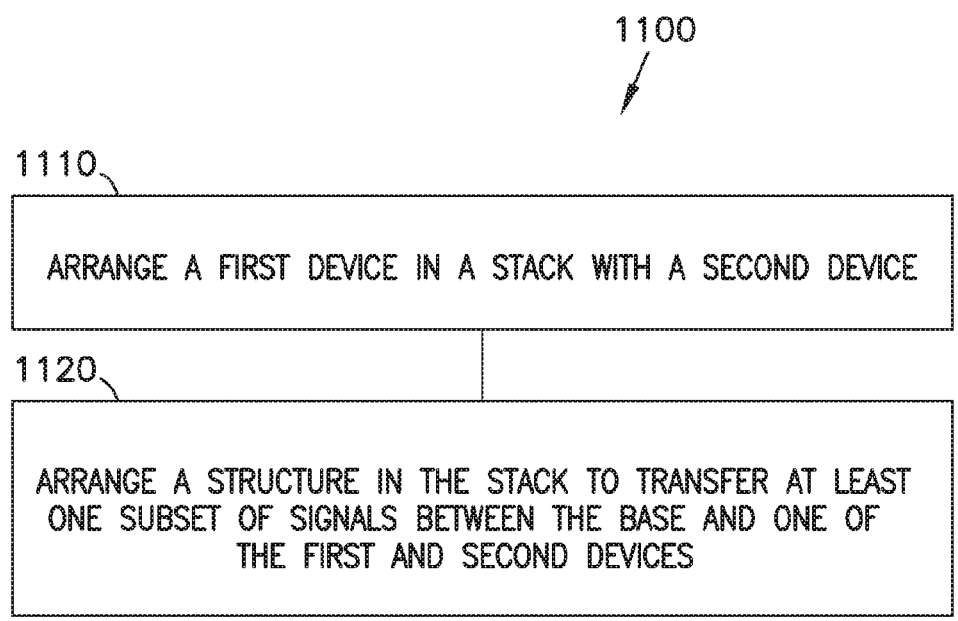
FIG. 11 is flowchart showing a method of arranging components including dice in a stack according to various embodiments of the invention.

FIG. 11 is flowchart showing a method 1100 of arranging components including dice in a stack according to various embodiments of the invention. Method 1100 may be used to arrange components of apparatus and an IC package that are similar or identical to apparatus 100 and IC packages 101, 200, 300, 400, 500, 600, 700, 800, and 900 described above with reference to FIG. 1 through FIG. 9. Thus, the components of apparatus and devices used in method 1100 may include the components of apparatus 110 and IC packages 101, 200, 300, 400, 500, 600, 700, 800, and 900 described above with reference to FIG. 1 through FIG. 9.

Activity 1110 of method 1100 may include arranging a first device in a stack with a second device. The first device may include at least one conductive path through the first device. Activity 1120 may include arranging a structure in the stack to transfer at least one subset of signals between a base and at least one of the first die and the second die. The structure may include conductive paths to transfer the signals and at least a portion of the conductive paths may go through vias of the structure. Method 1100 may arrange other components in ways similar to or identical to the arrangements of the components of apparatus 110 and IC packages 101, 200, 300, 400, 500, 600, 700, 800, and 900 described above with reference to FIG. 1 through FIG. 9.

Figure 12:
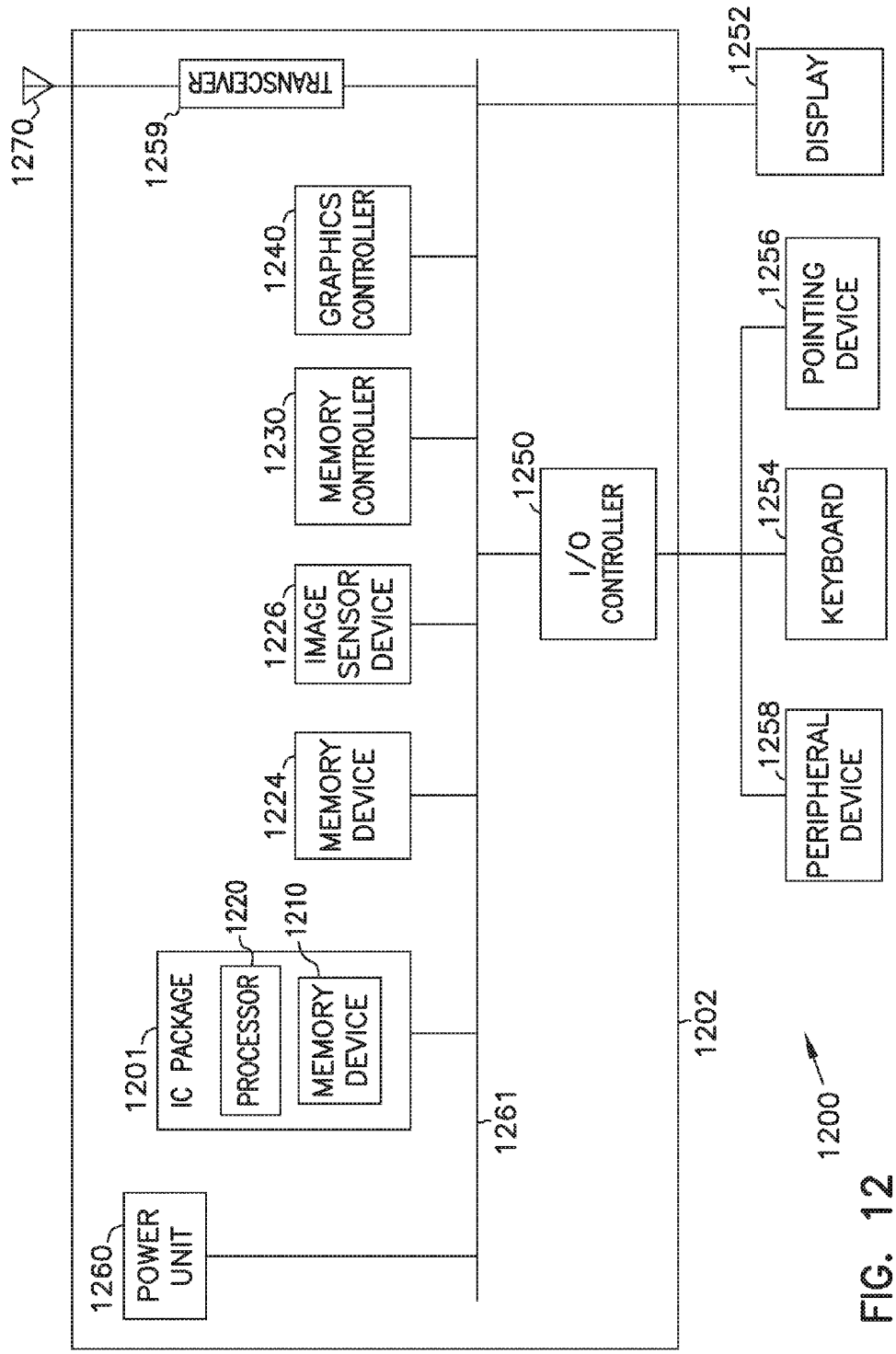
FIG. 12 shows a system including an IC package according to various embodiments of the invention.

FIG. 12 shows a system 1200 according to various embodiments of the invention. System 1200 may include an IC package 1201 having a memory device 1210 and a processor 1220, a memory device 1224, an image sensor device 1226, a memory controller 1230, a graphics controller 1240, an input and output (I/O) controller 1250, a display 1252, a keyboard 1254, a pointing device 1256, a peripheral device 1258, a transceiver 1259, or a power unit 1260, or a combination thereof. System 1200 may also include a bus 1261 to transfer information among the components of system 1200 and provide power to at least some of these components. System 1200 may further include a circuit board 1202 where some of the components of system may be attached, and an antenna 1270 to wirelessly transmit and receive information to and from system 1200. Transceiver 1259 may operate to transfer information between antenna 1270 and one or more of the components of system 1200 (e.g., at least one of IC package 1201 and memory device 1224).

Image sensor device 1220 may include a complementary metal-oxide-semiconductor (CMOS) image sensor having a CMOS pixel array or charge-coupled device (CCD) image sensor having a CCD pixel array.

Display 1252 may include an analog display or a digital display. Display 1252 may receive information from other components. For example, display 1252 may receive information that is processed by one or more of IC package 1201, memory device 1224, image sensor device 1226, and graphics controller 1240 to display information such as text or images.

Processor 1220 may include a general-purpose processor or an ASIC. Processor 1220 may include a single core processor or a multi-core processor. Processor 1220 may execute one or more programming commands to process information. The information may include information provided by other components of system 1200, memory device 1210 or image sensor device 1226.

Processor 1220 may include an embodiment of one or more of the various devices described herein, such as device 120, 220, 320, 420, 520, 620, 720, 820, or 920 described above with reference to FIG. 1 through FIG. 9.

Each of memory devices 1210 and 1224 may include a volatile memory device, a non-volatile memory device, or a combination of both. For example, each of memory devices 1220 and 1224 may include a dynamic random access memory (DRAM) device, a static random access memory (SRAM) device, a flash memory device, phase change memory device, or a combination of these memory devices.

Memory device 1210 may include an embodiment of one or more of the various devices described herein, such as device 110, 210, 310, 410, 510, 610, 710, 810, or 910 described above with reference to FIG. 1 through FIG. 9. FIG. 12 shows memory devices 1220 and 1224 being physically separated from each other. Memory devices 1220 and 1224, however, may be a single memory device, which may be included in IC package 1201.

The illustrations of apparatus (e.g., apparatus 100 and IC packages 101, 200, 300, 400, 500, 600, 700, 800, and 900) and systems (e.g., system 1200) are intended to provide a general understanding of the structure of various embodiments and are not intended to provide a complete description of all the components and features of apparatus and systems that might make use of the structures described herein.

Any of the components described above can be implemented in a number of ways, including simulation via software. Thus, apparatus (e.g., apparatus 100 and IC packages 101, 200, 300, 400, 500, 600, 700, 800, and 900) and systems (e.g., system 1200) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., apparatus 100 and IC packages 101, 200, 300, 400, 500, 600, 700, 800, and 900) and systems (e.g., system 1200), and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The apparatus and systems of various embodiments may include or be included in electronic circuitry used in high-speed computers, communication and signal processing circuitry, single or multi-processor modules, single or multiple embedded processors, multi-core processors, data switches, and application-specific modules including multi-layer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

One or more embodiments described herein include apparatus, systems, and methods having a base, a first die, a second arranged in a stacked with the first die and the base, and a structure located in the stack and outside at least one of the first and second dice and configured to transfer signals between the base and at least one of the first and second dice. Other embodiments including additional apparatus and methods are described above with reference to FIG. 1 through FIG. 11.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of other embodiments. Many other embodiments will be apparent to those of skill in the art upon reading and understanding the above description.

The Abstract is provided to comply with 37 C.F.R. § 1.72(b) requiring an abstract that will allow the reader to quickly ascertain the nature and gist of the technical disclosure. The Abstract is submitted with the understanding that it will not be used to interpret or limit the claims.

What is claimed is:

1. A system comprising:
   a base configured to receive signals;
   a memory device including first conductive paths at least partly through the memory device;
   a processor;
   a structure including an interposer arranged in a stack with the base, the memory device, and the processor, the interposer being located between the memory device and the processor and configured to transfer at least one subset of the signals to one of the memory device and the processor, the interposer including a first surface, a second surface opposite from the first surface, first conductive contacts located at the first surface and coupled to the first conductive paths of the memory device, second conductive contacts located at the second surface and coupled to the processor, and second conductive paths coupling the first conductive contacts to the second conductive contacts, wherein the signals from the base are transferred to the processor through only the first and second conductive paths and the first and second conductive contacts;
   wherein the structure further includes a first structure portion and a second structure portion, the first structure portion being located at a first side of the memory device and including conductive paths coupled to the base and the interposer, the second structure portion being located at a second side of the memory device and including conductive paths coupled to the base and the interposer;
   wherein die memory device includes a first stack of dice and a second stack of dice arranged side by side with each other;
   wherein the structure further includes a third structure portion located between the first stack of dice and the second stack of dice, the third structure portion including conductive paths coupled to the base and the interposer; and
   wherein at least one of the first, second, and third structure portions is incorporated into a die of at least one of the first and second stacks of dice.

2. The system of claim 1, wherein the interposer includes a length measured between edges of the interposer, the length of the interposer is greater than a length of the memory device.

3. The system of claim 1, wherein the interposer includes a via extending from the first surface to the second surface, at least a portion of one of the second conductive paths passing through the via.

4. The system of claim 1,
   wherein the interposer includes multiple layers, each of the multiple layers including at least one conductive portion coupled to at least one of second conductive paths to transfer a different subset of the signals.

5. The system of claim 1, wherein the interposer includes a first conductive portion located inside the interposer and between the first and second surfaces, the first conductive coupled to a first selected conductive path of the second conductive paths to transfer a first power signal having a positive value, and a second conductive portion located inside the interposer and between the first and second surfaces, the first conductive, the second conductive portion coupled to a second selected conductive path of the second conductive paths to transfer a second power signal having a ground potential, at least one of the first and second conductive portions extending in a dimension perpendicular to the first and second selected conductive paths.

6. The system of claim 5,
wherein the first selected conductive path goes through a via that only extends partly through the interposer.

7. The system of claim 6, wherein the second selected conductive path goes through an additional via that only extends partly through the interposer.

8. The system of claim 7, wherein the memory device includes a conductive segment coupled to a selected conductive path of the first conductive paths to transfer a data signal, the conductive segment extending in a dimension perpendicular to the selected conductive path.

\* \* \* \* \*